United States Patent [19]

Engelmann

[11] 3,899,752

[45] Aug. 12, 1975

[54] MICROWAVE OSCILLATOR

[75] Inventor: Herbert F. Engelmann, Kinnelon, N.J.

[73] Assignee: Engelmann Microwave Co., Montville, N.J.

[22] Filed: Nov. 15, 1973

[21] Appl. No.: 416,082

[52] U.S. Cl. .............................. 331/101; 331/117 D

[51] Int. Cl.$^2$ .............................................. H03B 5/24

[58] Field of Search ......... 331/99, 117 D, 101, 102, 331/100

[56] References Cited

UNITED STATES PATENTS

| | | | |
|---|---|---|---|
| 2,310,695 | 2/1943 | Higgins | 331/99 |
| 2,405,229 | 8/1946 | Mueller et al. | 331/99 |
| 3,140,444 | 7/1964 | Carlson | 331/117 |
| 3,159,798 | 12/1964 | Burns | 331/117 |
| 3,315,180 | 4/1967 | Racy | 331/117 |
| 3,349,341 | 10/1967 | Schoniger | 331/117 |
| 3,577,100 | 5/1971 | Askew | 331/117 |

FOREIGN PATENTS OR APPLICATIONS

| | | | |
|---|---|---|---|
| 123,169 | 7/1948 | Australia | 331/99 |

*Primary Examiner*—John Kominski
*Attorney, Agent, or Firm*—Bain, Gilfillan & Rhodes

[57] ABSTRACT

An improved microwave oscillator wherein the oscillator includes a resonator assembly provided with a movable resonator member for varying the frequency response of the oscillator and which further includes a transistor, the improvement including means for varying the electrical coupling between a lead of the transistor and the resonator assembly to provide optimum coupling between the transistor lead and the resonator assembly for maximum power output; means for compensating for variations in frequency response of the oscillator upon different transistors being positioned different distances from the resonator assembly; coupling means electrically associated with the transistor to assure proper coupling between the transistor and the resonator assembly at the low frequencies; means for providing additional feedback to the transistor to assure sufficient feedback to sustain low frequency oscillation of the transistor which is typically chosen and designed for high frequency oscillation; and a flexible linkage interconnected between the resonator movable member and the apparatus for moving the resonator movable member whereby any lateral misalignment between structural members and apertures is compensated for.

4 Claims, 1 Drawing Figure

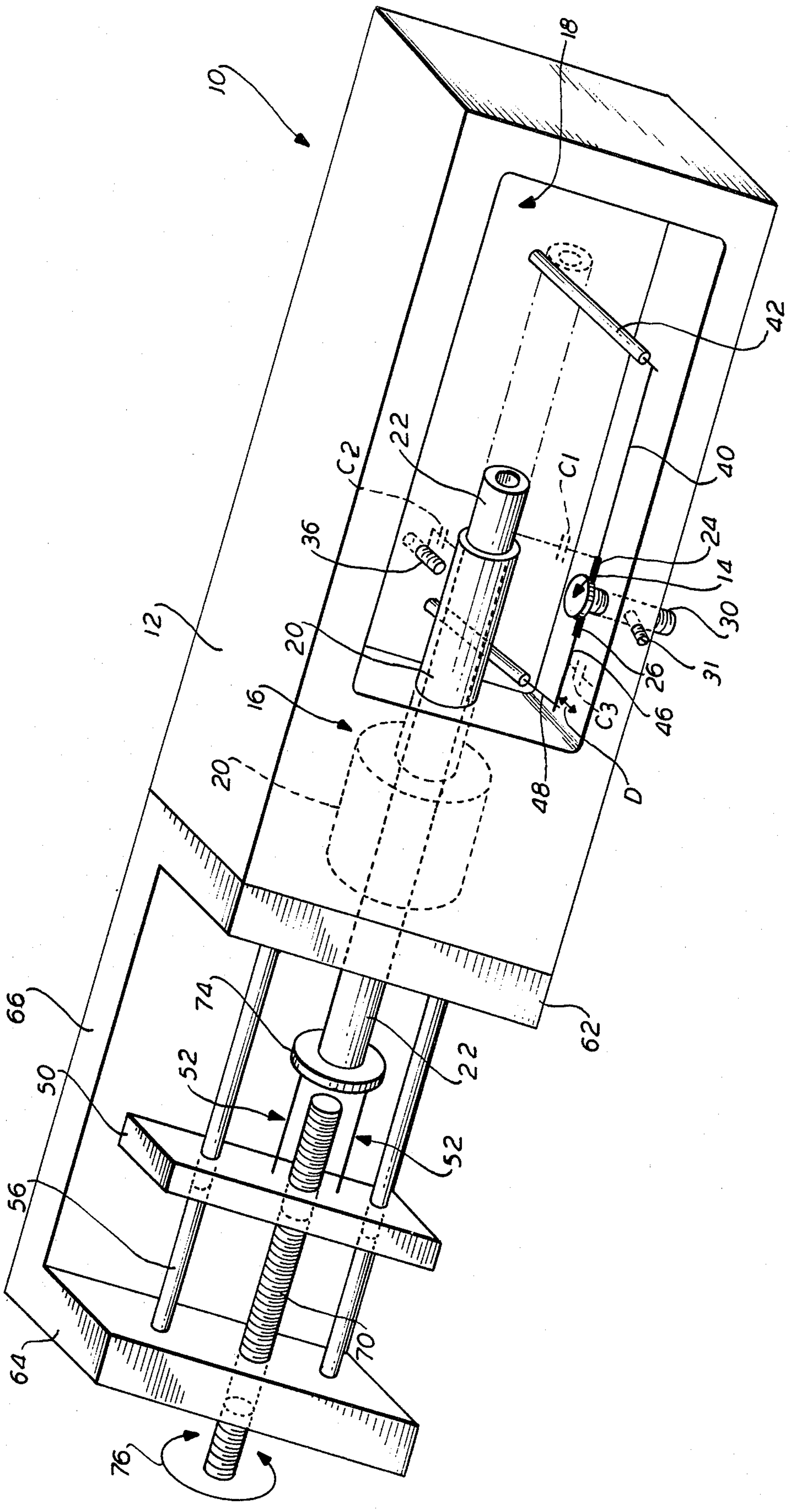
10
18
42
40
22
C2
C1
36
24
14
30
31
26
46
12
20
16
C3
48
D
20
66
74
62
22
52
50
52
56
70
64
76

MICROWAVE OSCILLATOR

BACKGROUND OF THE INVENTION

This invention relates to improvements in microwave oscillators, and in particular relates to improvements in mechanically tunable wide band microwave oscillators.

As is known to those skilled in the art, a typical microwave oscillator may include a housing in which is mounted a resonator assembly including a choke and a movable resonator surrounded by the choke. Such oscillator may further include a transistor connected in the feedback mode for oscillation. The resonator assembly movable member being extendible or retractable into or from a cavity formed in a housing to vary the frequency response of the oscillator. The housing is the general structural member of the oscillator and is typically at ground potential.

As is further known to those skilled in the art, the transistor is electrically coupled to the resonator assembly, for example, the base lead of the transistor may be capacitively coupled to the resonator assembly by being positioned a predetermined distance therefrom.

However, as if further known to those skilled in the art, different transistors experience or exhibit different coupling upon being positioned the same distance from the resonator assembly. Since in fabrication the transistors are positioned relative to the resonator assembly for optimum electrical coupling for maximum power output from the oscillator at the high frequency end of the frequency band, this means that different transistors must be positioned different distances from the resonator assembly to achieve the desired optimum electrical coupling. Accordingly, there exists a need in the microwave oscillator art of means for varying the electrical coupling between the transistor and the resonator assembly to provide optimum electrical coupling between the transistor and the resonator assembly.

Since as noted above different transistors may be positioned different distances from the resonator assembly to provide the different microwave oscillators with the same optimum coupling between the different transistors and their associated resonator assemblies, a further problem is encountered since, as is known to those skilled in the art, the positioning of the different transistors at different distances from the resonator assembly with the resonator movable member in a fixed position, will cause the different microwave oscillators to have a different frequency response due to the different coupling, for example the different capacitive couplings between the different transistors and their respective microwave resonator assemblies. Hence, there exists a need in the art for means for compensating for the variations in frequency response caused by positioning different transistors different distances from their associated resonator assemblies. This problem, as if further understood by those skilled in the art, is particularly acute when there is a high desirability, or perhaps even necessity, that different microwave oscillators track perfectly with regard to their frequency responses vis-a-vis the positions of the movable resonator assembly members. Further, such tracking requires that the frequency responsive at each end of the frequency band be substantially the same between different microwave oscillators upon their respective movable resonator members being at their extreme positions.

As is further known to those in the microwave oscillator art, it is desired that the transistor be positioned opposite the resonator assembly at a high impedance point for optimum coupling to assure that oscillation is sustained, but since as the resonator movable member is extended into the cavity to lower the frequency response of the oscillator, the high impedance point moves and hence coupling between the transistor and the microwave resonator can become so poor that oscillation will not be sustained at the low frequency end of the frequency band of the oscillator.

Since it is highly impractical or prohibitively expensive to mount the transistor in a movable member to move along parallel to the resonator lmovable member, and since, as noted above, the transistor is mounted stationarily along a line perpendicular to the path of movement of the resonator movable member, there exists a means for assuring proper coupling between the transistor and the resonator assembly to sustain oscillations at the low frequency end of the frequency band.

As is further known to those skilled in the art, the transistors chosen for the high frequency, wide band microwave oscillators are typically chosen or designed for their characteristics at high frequency operation, and hence, such transistors typically have insufficient internal feedback to assure oscillation at the low frequency end of the frequency band. Accordingly, there exists a need in the art to assure sufficient feedback such that oscillation at the low frequency end of the frequency band is assured.

As is further known to those skilled in the mechanically tunable wide band microwave oscillator art, wherein the tuning is achieved mechanically typically by the clockwise and counterclockwise rotation of a lead screw to alternately extend the resonator movable member into the resonator cavity or to retract the resonator movable member from the cavity, a major aligning problem, in particular a lateral aligning or misaligning problem, is experienced in maintaining the resonator movable member and the means for extending and retracting the resonator movable member, including the apertures through which the members pass, in coaxial alignment. Accordingly, there exists a need in the mechanically tunable wideband microwave oscillator art for means for accommodating for such alignment or misalignment problem.

SUMMARY

The present invention provides an improved microwave oscillator by providing means for varying the electrical coupling between the transistor and the resonator assembly to provide optimum electrical coupling for maximum power output; means for compensating for variations in frequency due to different transistors being positioned different distances from the resonator assembly for maximum electrical coupling; means for assuring proper coupling between the transistor and the resonator assembly to sustain oscillation at the low frequency end of the frequency band; ;means for providing sufficient feedback to the transistor to assure oscillation at the low frequency end of the frequency band; and means for overcoming the above-noted alignment or misalignment problem between the resonator movable member and the structure for extending and retracting the resonator movable member in the resonator cavity.

DESCRIPTION OF THE DRAWING

The drawing is a diagrammatic view, in perspective, of a microwave oscillator embodying the present invention.

DESCRIPTION OF THE INVENTION

Referring now to the drawing, there is shown a diagrammatic illustration of a tunable wide band microwave oscillator embodying the present invention and indicated by general numerical designation 10. The oscillator may include a housing 12 of some suitable metal such as aluminum, a transistor indicated by general numerical designation 14 and a resonator assembly indicated by general numerical designation 16.

The housing 12 has a resonator cavity formed therein and which cavity is indicated by general numerical designation 18.

The resonator assembly 16, as shown, is a coaxial choke coupled resonator assembly including a choke 20 coaxially aligned with and surrounding a movable resonator member 22. The resonator movable member 22 is generally cylindrical in configuration and has its outer surface covered with a suitable insulating material in the manner known to those skilled in the art. As is further known to those skilled in the art, the resonator movable member 22 is extended into the cavity 18, as shown in dashed outline, to vary the frequency response of the oscillator, and more particularly, to lower the frequency response of the oscillator as the resonator movable member is extended further rightwardly as shown in the drawing.

The transistor 14, as shown in the drawing, is operated in the grounded collector mode and includes a base lead 24 and an emitter lead 26. It will be understood that the collector lead which is not shown in the drawing is grounded to the housing 12 in a manner described below. More specifically, it will be understood that the transistor 14 is suitably mounted on a stud 30 which is in sliding engagement with a complementary bore formed in the housing 12 in which the stud 30 is received. The stud is made of a suitable metal and adjustably maintained in position by a set screw 31 which is received within a threaded bore in housing 12. It will be understood that the transistor collector lead, not shown, is electrically interconnected to the stud 30 and hence is electrically interconnected with and at the ground potential of the housing 12.

As noted above, upon the resonator movable member 22 being moved leftwardly in the cavity 18 to its substantially leftmost position, the oscillator is tuned for substantially the highest frequency of the frequency band and as noted above and understood by those skilled in the art, for maximum power output of the oscillator at the high frequency end of the frequency band, optimum electrical coupling must be provided between the transistor lead, namely the emitter lead 24, and the resonator assembly 16.

In the present embodiment, the transistor base lead 24 is capacitively coupled to the resonator assembly as indicated by the capacitor C1 shown in dashed outline and the capacitive coupling between the transistor lead 24 and the resonator assembly is determined, inter alia, by the distance the base lead 24 is positioned relative to the resonator assembly 16 along a line generally perpendicular to the longitudinal axis of the resonator assembly and through the base lead 24.

It being further understood by those skilled in the art that with the resonator movable member 22 in its substantially leftmost position for substantially the highest frequency response of the frequency band, the transistor base lead 24 is substantially opposite to an effective high impedance point along the resonator assembly 16.

Since, as noted above, different transistors, due to their inherent characteristics, require different capacitive couplings to the resonator assembly 16, and since it is desirable to fabricate the oscillators such that each different transistor is optimally electrically coupled to the resonator assembly 22, the oscillator is provided with the aforementioned stud 30 on which the transistors may be mounted whereby the different transistors may be optimally coupled, e.g. capacitively coupled as indicated by the dashed line capacitor C1, by displacing the stud to move the transistor toward or away from the resonator assembly 16 whereby the optimum electrical coupling may be achieved for each different transistor mounted in the different microwave oscillators embodying the present invention.

As noted above, upon different transistors being mounted different distances from the resonator assembly and with the resonator movable assembly 22 in a fixed position, e.g., the leftmost position for high frequency response, the frequency response of the microwave oscillators is varied due to the different transistors being mounted different distances from the resonator assembly. Hence, microwave oscillators according to the present invention are provided with means for compensating for such variations in frequency response whereby the oscillators may be provided with the same frequency response upon the movable resonator member being in a fixed position but with the leads of different transistors being positioned different distances from the resonator assembly. Such means, in accordance with the present invention, may include a threaded metallic screw 36 received within a complementarily formed threaded bore formed in the wall of the housing 12. The metal screw 36 upon being advanced toward or away from the resonator assembly 16 provides variable capacitive coupling indicated by capacitor C2 shown in dashed outline between the resonator assembly and the housing 12 whereby variable additional capacity may be provided so as to provide different microwave oscillators with the same frequency response with their respective transistors being positioned different distances from their respective resonator assemblies and with the respective resonator movable members remaining in a fixed position. Hence, tracking between different microwave oscillators embodying the present invention is provided.

As noted above, when the resonator movable member 22 is extended rightwardly into the resonator cavity 18 to lower the frequency response of the oscillator, for desirable coupling between the transistor 14 and the resonator assembly 16, the transistor would be likewise moved rightwardly so as to remain opposite the high impedance point of the resonator assembly which, as known to those skilled in the art, is effectively moved rightwardly upon the resonator movable member being extended rightwardly.

Further, since, as noted above, from practical and economic standpoints, the transistor 14 is mounted stationarily with respect to the resonator assembly 16 along a line perpendicular to the axis of the assembly, means are needed to assure coupling between the stationarily mounted transistor and the extended resonator movable member 22. In accordance with the teaching of the present invention, a longitudinally extending electrically conductive coupling member 40 may be provided and which coupling member is electrically interconnected between the transistor base lead 24 and the power input lead 42 which is connected to a suitable power supply, not shown. The longitudinally extending electrically conductive coupling member 40 may be, for example, a predetermined length of electrically conductive wire. Thus, as the resonator movable member 22 is extended into the resonator cavity 18 rightwardly as shown in dashed outline, and wherein the effective high impedance point of the resonator assembly is moved rightwardly, the longitudinally extending electrically conductive coupling member 40 assures proper or sufficient coupling between the transistor 14 and the resonator assembly 16 to sustain oscillation at the low frequency end of the frequency band. The length of the coupling member 40 is predetermined to provide the desired or required amount of coupling.

As further noted above, the transistor 14 is typically chosen for its inherent characteristics providing oscillation at the high frequency end of the frequency band, and hence, as noted above, such transistors typically have insufficient internal feedback to assure oscillation at the low frequency end of the frequency band. Hence, in accordance with the teaching of the present invention, the electrical conductor 46 electrically interconnecting the transistor emitter lead 26 with its power input lead 48 connected to a suitable power supply not shown is positioned a predetermined distance indicated by D from the housing 12 whereby capacitive coupling, indicated by capacitor C3 shown in dashed outline, is provided between the emitter lead 26 and the housing 12 to assure oscillation at the low frequency end of the frequency band. The distance D is predetermined to provide the desired or required amount of coupling.

As further noted above, a major alignment or misalignment problem is typically present in the typical prior art mechanically tunable wide band microwave oscillator due to the requirement of coaxially aligning the longitudinally extending axis of the resonator movable member 22 with the structural members and their associated apertures for extending and retracting the resonator movable member 22 within the cavity 18. The major problem, as also noted above, is that of accommodating any lateral misalignment and in accordance with the teaching of the present invention, such alignment or lateral misalignment problem is overcome by interconnecting the leftward end of the resonator movable member 22 to a travelling block 50 by means of flexible linkage indicated by general numerical designation 52 for accommodating for any such lateral misalignment. The travelling block 50 may be mounted on a pair of rails 56 secured between displaced support members 62 and 64 and which support members may be suitably structurally interconnected by a support member 66 formed integrally therewith or suitably secured thereto; the support member 62 being suitably secured to the housing 12 by suitable members, such as for example, threaded members not shown. The travelling block 50 is provided with a pair of apertures, as shown, for slidably receiving the rails 56 which are suitably secured between the support members 62 and 64 in a parallel manner. The travelling block 50 is also provided with a generally centrally formed threaded aperture for threadedly receiving the threaded lead screw 70 extending therethrough and in threaded engagement therewith, the other end of the lead screw 70 being received rotatably in and extending through an aperture formed in the support member 64. The leftward end of the resonator movable member extends slidably through an aperture formed in the support member 62 and is provided with an enlarged annular stop ring 74 suitably secured thereto. The apertures formed in the support members 62 and 64, the threaded aperture formed in the travelling block 50 and the longitudinal axis of the resonator movable member 22 are in substantial coaxial alignment. However as is known to those skilled in the art there is great difficulty in achieving perfect coaxial alignment between such numerous apertures and structure and at least some lateral misalignment is typically present.

The flexible linkage 52, in accordance with the teaching of the present invention, may be suitable metallic wires, for example made of stainless steel and suitably mechanically secured to the travelling block 50 and an annular ring suitably mechanically secured to the leftward end of the resonator movable member 22. The wires 52, in accordance with the teaching of the present invention, are sufficiently strong in tension to be able to impart rightward and leftward movement to the resonator movable member 22 upon the lead screw being rotated clockwise and counterclockwise as shown by the arrow 76 to advance or retract the travelling block 50, and such flexible wires 52 are sufficiently flexible or movable in the lateral direction relative to the axis of the lead screw 70, the apertures formed in the support member 64 and travelling block 50 into which the lead screw 70 extends, and the aperture formed in the housing 12 through which the resonator movable member extends, to accommodate or compensate for misalignment between such noted structural members and their respective apertures.

It will be understood by those skilled in the art that many modifications and variations may be made in the present invention without departing from the spirit and the scope thereof.

What is claimed is:

1. In a tunable wide band microwave oscillator having a frequency band including a high frequency end, and which tunable wide band microwave oscillator includes a resonator assembly for varying the frequency of said oscillator and a transistor having a lead capacitively coupled to said resonator assembly, the improvement comprising:

mechanical means for supporting said transistor and for varying the distance between said transistor and thereby said transistor lead and said resonator assembly to vary the capacitive coupling between said transistor lead and said resonator assembly to provide optimum capacitive coupling between said transistor lead and said resonator assembly for maximum power output from said oscillator at the high frequency end of said frequency band;

a housing in which said resonator assembly is mounted and which receives said transistor means; and said mechanical means mounted reciprocably in said housing for moving said transistor and thereby said transistor lead toward or away from said resonator assembly.

2. Apparatus according to claim 1 wherein said reciprocably mounted mechanical means comprises a stud in sliding engagement with and extending into a bore formed in said housing.

3. In a mechanically tunable wide band microwave oscillator including a housing having a pair of opposed ends and a cavity formed therein and including a resonator assembly mounted in one end of said housing and said resonator assembly including a co-axially aligned choke and a movable resonator member slidably received within said choke and having a longitudinally extending axis and a pair of opposed ends with one of said ends residing in said cavity and said movable resonator member extendible into said cavity along a predetermined path to lower the frequency response of said oscillator and retractable out of said cavity along said predetermined path to raise the frequency response of said oscillator, the improvement comprising:

a first support member secured to said one end of said housing and said first support member having an aperture formed therein in substantial coaxial alignment with said longitudinally extending axis of said movable resonator member;

a second support member displaced from said first support member and said second support member having an aperture formed therein in substantial coaxial alignment with said longitudinally extending axis of said movable resonator member;

a third support member structurally interconnecting said first and said second support members;

a lead screw generally disposed between said first and said second support members and said lead screw having a pair of opposed ends, one end of said lead screw extending through said aperture formed in said second support member and said lead screw received rotatably within said aperture formed in said second support member;

a pair of longitudinally extending rails having longitudinally extending axes secured between said first and said second support members in a generally parallel manner with their axes displaced from and generally parallel to said lead screw;

a travelling block having a pair of apertures formed therein for slidably receiving said reails and also having a threaded aperture formed generally centrally thereof in substantial coaxial alignment with said apertures formed in said first and said second support members, said threaded aperture for receiving and threadedly engaging said lead screw;

flexible linkage secured between said travelling block and said other end of said movable resonator member for extending said movable resonator member into said cavity upon rotation being imparted to said lead screw in one direction to move said travelling block toward said one end of said housing and for retracting said movable resonator member out of said cavity upon rotation being imparted to said lead screw in the opposite direction to move said travelling block away from said one end of said housing, and said flexible linkage for accommodating any misalignment between said substantial coaxial alignment of said movable resonator member, and said apertures formed in said first and second support members and said threaded aperture formed in said travelling block.

4. In combination in a mechanically tunable microwave oscillator having a frequency band including a low frequency end and a high frequency end, said oscillator including a housing and said housing having a cavity formed therein, saaid oscillator including a resonator assembly mounted in said housing and including coaxially aligned choke and movable resonator member slidably received within said choke and said movable resonator member having a longitudinally extending axis and being extendible into and retractable from said cavity along a predetermined path to vary the frequency response of said oscillator, and said oscillator further including first and second power input leads mounted in said housing and extending into said cavity and a transistor received within said cavity, said transistor including a first lead connected to said first power input lead and electrically coupled to said resonator assembly and said transistor including a second lead connected to said second power input lead, the improvement comprising:

means for varying the electrical coupling between said first transistor lead and said resonator assembly to provide optimum electrical coupling between said first transistor lead and said resonator assembly for maximum power output from said oscillator at the high frequency end of said frequency band;

a first longitudinally extending electrically conductive coupling member mounted in said cavity along said predetermined path of said movable resonator member at a predetermined distance therefrom and said longitudinally extending coupling member being electrically interconnected between said first transistor lead and said first power input lead whereby upon said movable resonator member being extended into said cavity to lower said frequency response of said oscillator said longitudinally extending coupling member providing sufficient coupling between said transistor lead and said extended movable resonator member to sustain oscillation at said low frequency end of said frequency band;

a second longitudinally extending electrically conductive member electrically interconnected between said second lead and second power input lead, said longitudinally extending electrically conductive member mounted in said cavity and displaced a predetermined distance from said housing to provide sufficient capacitive coupling between said second lead and said housing whereby sufficient feedback is provided to said transistor to assure oscillation at said low frequency end of said frequency band;

mechanical means including a pair of structurally interconnected support members and a travelling block slidably supported on rails extending between said support members and one of said support members and said travelling block having apertures formed therein for receiving a lead screw for advancing and retracting said travelling block and said other support member having an aperture formed therein for slidably receiving the other end of said movable resonator member, and said mechanical means further including flexible linkage mechanically interconnecting said travelling block and said movable resonator member and for extending and retracting said movable resonator member into and from said cavity upon said lead screw advancing and retracting said travelling block, said apertures and said movable resonator member being in substantial coaxial alignment and said flexible linkage compensating for any co-axial misalignment between said apertures and said movable resonator member.

* * * * *